(12) United States Patent
Iwata et al.

(10) Patent No.: US 9,698,568 B2
(45) Date of Patent: Jul. 4, 2017

(54) VERTICAL-CAVITY SURFACE-EMITTING LASER DEVICE AND VERTICAL-CAVITY SURFACE-EMITTING LASER ARRAY DEVICE

(71) Applicant: MURATA MANUFACTURING CO., LTD., Kyoto-fu (JP)

(72) Inventors: Keiji Iwata, Kyoto-fu (JP); Ippei Matsubara, Kyoto-fu (JP); Takayuki Kona, Kyoto-fu (JP); Hiroshi Watanabe, Kyoto-fu (JP); Masashi Yanagase, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 14/538,007

(22) Filed: Nov. 11, 2014

(65) Prior Publication Data

US 2015/0063394 A1    Mar. 5, 2015

Related U.S. Application Data

(63) Continuation of application No. PCT/JP2013/064302, filed on May 23, 2013.

(30) Foreign Application Priority Data

May 25, 2012   (JP) ................................ 2012-119459

(51) Int. Cl.
*H01S 5/183*   (2006.01)
*H01S 5/022*   (2006.01)
(Continued)

(52) U.S. Cl.
CPC .............. *H01S 5/183* (2013.01); *H01L 24/75* (2013.01); *H01L 24/83* (2013.01);
(Continued)

(58) Field of Classification Search
CPC .............. H01K 13/0408; H01S 5/0425; H01S 5/183–5/187; H01L 21/6838
(Continued)

(56) References Cited

U.S. PATENT DOCUMENTS 5,348,316 A * 9/1994 Lin ..................... H01L 21/6838
228/44.7
2003/0231682 A1   12/2003 Eitel
(Continued)

FOREIGN PATENT DOCUMENTS

CN   101127433 B   5/2010
EP      1357648 A1   10/2003
(Continued)

OTHER PUBLICATIONS

International Search Report; PCT/JP2013/064302; Aug. 27, 2013.
(Continued)

*Primary Examiner* — Joshua King
(74) *Attorney, Agent, or Firm* — Studebaker & Brackett PC

(57) ABSTRACT

A cathode electrode, cathode pad electrodes, cathode wiring electrodes, an anode electrode, an anode pad electrode, and an anode wiring electrode are disposed on the surface of a vertical-cavity surface-emitting laser device. A light-emitting-region multilayer portion having active layers sandwiched by clad layers and DBR layers is formed directly below the anode electrode. A region where the light-emitting-region multilayer portion is formed serves as a light-emitting region. The light-emitting region is positioned closer to one end of the first direction than is a suction region onto which a flat collet sucks with respect to the first direction, in such a way that the light-emitting region is substantially in contact with or spaced a predetermined distance from the suction region.

13 Claims, 5 Drawing Sheets

(51) Int. Cl.
  *H01S 5/34* (2006.01)
  *H01L 23/00* (2006.01)
  *H01S 5/042* (2006.01)
  *H01S 5/42* (2006.01)
  *H01S 5/02* (2006.01)
  *H01S 5/343* (2006.01)

(52) U.S. Cl.
  CPC ...... *H01S 5/02276* (2013.01); *H01S 5/18311* (2013.01); *H01S 5/34* (2013.01); *H01S 5/0208* (2013.01); *H01S 5/0425* (2013.01); *H01S 5/3432* (2013.01); *H01S 5/423* (2013.01)

(58) Field of Classification Search
  USPC .......................................................... 29/740
  See application file for complete search history.

(56) References Cited

U.S. PATENT DOCUMENTS

| | | | |
|---|---|---|---|
| 2004/0213310 A1* | 10/2004 | Otoma | 372/45 |
| 2005/0151137 A1 | 7/2005 | Steinle | |
| 2007/0091963 A1* | 4/2007 | Nagawa | 372/50.124 |
| 2008/0043793 A1 | 2/2008 | Ueki et al. | |
| 2008/0080583 A1 | 4/2008 | Ueki et al. | |
| 2010/0325884 A1* | 12/2010 | Nishino et al. | 29/833 |

FOREIGN PATENT DOCUMENTS

| | | |
|---|---|---|
| JP | 55-15265 A | 2/1980 |
| JP | H04-348580 A | 12/1992 |
| JP | H05-251483 A | 9/1993 |
| JP | 2001-015861 A | 1/2001 |
| JP | 2003-218131 A | 7/2003 |
| JP | 2003-229637 A | 8/2003 |
| JP | 2006-114831 A | 4/2006 |
| JP | 2007-250669 A | 9/2007 |
| JP | 2008-034638 A | 2/2008 |
| JP | 2008-47717 A | 2/2008 |
| JP | 2008-85161 A | 4/2008 |
| JP | 2008-135596 A | 6/2008 |
| JP | 2009-283859 A | 12/2009 |
| KR | 10-2009-0106084 A | 10/2009 |

OTHER PUBLICATIONS

Written Opinion of the International Searching Authority; PCT/JP2013/064302; Aug. 27, 2013.

An Office Action issued by the German Patent Office on Aug. 14, 2015, which corresponds to German Patent Application No. 11 2013 002 684.8 and is related to U.S. Appl. No. 14/538,007; with English language translation.

An Office Action issued by the Japanese Patent Office on Nov. 4, 2015, which corresponds to Japanese Patent Application No. 2014-516842 and is related to U.S. Appl. No. 14/538,007; with English language translation.

An Office Action; "Notice of Reasons for Rejection," issued by the Japanese Patent Office on Mar. 8, 2016, which corresponds to Japanese Patent Application No. 2014-516842 and is related to U.S. Appl. No. 14/538,007; with English language translation.

* cited by examiner (DIRECTION PERPENDICULAR TO MOUNTING SURFACE OF PCB) =
(DIRECTION PERPENDICULAR TO LIGHT-EMITTING SURFACE OF VCSEL)

(DIRECTION PERPENDICULAR TO MOUNTING SURFACE OF PCB) ≠
(DIRECTION PERPENDICULAR TO LIGHT-EMITTING SURFACE OF VCSEL)

VERTICAL-CAVITY SURFACE-EMITTING LASER DEVICE AND VERTICAL-CAVITY SURFACE-EMITTING LASER ARRAY DEVICE

CROSS REFERENCE TO RELATED APPLICATIONS

This application claims benefit of priority to Japanese Patent Application No. 2012-119459 filed May 25, 2012, and to International Patent Application No. PCT/JP2013/064302 filed May 23, 2013, the entire content of each of which is incorporated herein by reference.

TECHNICAL FIELD

The present technical field relates to a vertical-cavity surface-emitting laser device that emits laser light in a direction perpendicular to the mounting surface, and a vertical-cavity surface-emitting laser array device that has an array of a plurality of such vertical-cavity surface-emitting laser devices.

BACKGROUND

Currently, vertical-cavity surface-emitting laser (VCSEL) devices are in practical use as a type of semiconductor laser. Hereinafter, a vertical-cavity surface-emitting laser device will be referred to as "VCSEL device".

A VCSEL device has a general structure in which, as disclosed in Japanese Unexamined Patent Application Publication No. 2007-250669, for example, a first distributed Bragg reflector (DBR) layer is formed on top of a base substrate. A first spacer layer is formed on top of the first DBR layer. An active layer with quantum wells is formed on top of the first spacer layer. A second spacer layer is formed on top of the active layer. A second DBR layer is formed on top of the second spacer layer. An anode electrode is formed on top of the second DBR layer. Application of a driving signal between the anode electrode and a cathode electrode, which is in electrical continuity with the first DBR layer, produces laser light that has a sharp directivity in a direction perpendicular to the substrate (parallel to the stacking direction).

As described above, in a VCSEL device, the above-mentioned layers are stacked on the surface of the base substrate to form a multilayer body, and laser light is emitted from the surface of the multilayer body. The VCSEL device is mounted onto a mounting circuit board having external circuitry, in such a way that its base substrate side abuts on the mounting circuit board.

Therefore, when mounting a VCSEL device on a mounting circuit board, a die bond agent is previously applied to the position on which the VCSEL device is to be mounted, and the VCSEL device is placed on the applied die bond agent.

At this time, the VCSEL device is mounted as follows. First, the VCSEL device is picked up by a die collet or the like from its pre-mounting location (such as the surface of a dicing tape). The VCSEL device is carried to a mounting position on the mounting circuit board while being picked up by the die collet. Then, the VCSEL device is placed on the die bond agent by the die collet.

SUMMARY

Technical Problem

FIGS. 8(A) through 8(D) illustrate a problem that arises when mounting a conventional VCSEL device to the mounting circuit board. FIG. 8(A) illustrates a pick-up state of the VCSEL device when the VCSEL device is picked up properly. FIG. 8(B) illustrates how the VCSEL device is mounted on the mounting circuit board when the VCSEL device is picked up properly. FIG. 8(C) illustrates a pick-up state of the VCSEL device when the VCSEL device is picked up in a tilted state. FIG. 8(D) illustrates how the VCSEL device is mounted on the mounting circuit board when the VCSEL device is picked up in a tilted state.

As illustrated in FIG. 8(A) and FIG. 8(C), conventionally, a pyramidal collet is generally used as a die collet DC. A pyramidal collet picks up a VCSEL device in such a way that only the corners of the VCSEL device are in contact with the collet.

From the same side as the light-emitting surface of a VCSEL device 10P, the die collect DC approaches the VCSEL device 10P in a direction perpendicular to the light-emitting surface, and sucks the VCSEL device 10P from the light-emitting surface side. At this time, the die collect DC is a pyramidal collet, and picks up the VCSEL device 10P while in contact with the corner portions of the VCSEL device 10P. Accordingly, a space is created between the light-emitting surface of the VCSEL device 10P and the bottom surface of the pick-up portion of the die collet DC.

As illustrated in FIG. 8(A), when the VCSEL device 10P is picked up properly, the bottom surface of the pick-up portion of the die collet DC, and the light-emitting surface of the VCSEL device 10P and the mounting surface of the VCSEL device 10P opposite to the light-emitting surface are parallel to each other. In this case, when the VCSEL device 10P is placed on the surface of the die bond agent DB, as illustrated in FIG. 8(B), the mounting surface of the VCSEL device 10P and the mounting surface of a mounting circuit board PCB are parallel to each other. Therefore, the direction in which the VCSEL device 10P emits laser light is perpendicular to the mounting surface of the mounting circuit board PCB, resulting in an ideal mounting state.

As illustrated in FIG. 8(C), in some cases, the VCSEL device 10P is picked up in a state in which the bottom surface of the pick-up portion of the die collet DC, and the light-emitting surface and mounting surface of the VCSEL device 10P are inclined to each other at a predetermined angle. In this case, when the VCSEL device 10P is placed on the surface of the die bond agent DB, as illustrated in FIG. 8(D), the mounting surface of the VCSEL device 10P, and the mounting surface of the mounting circuit board PCB do not become parallel to each other. Consequently, the direction in which laser light is emitted by the VCSEL device 10P is not perpendicular to the mounting surface of the mounting circuit board PCB. At this time, when a waveguide such as an optical fiber is provided so that the laser light is transmitted in a direction perpendicular to the mounting surface, transmission loss occurs.

For this reason, it is required to pick up the VCSEL device in such a way as to ensure that the mounting surface of the VCSEL device becomes parallel to the mounting surface of the mounting circuit board.

An example of a method to address this problem is to use, as the die collet DC, a flat collet whose pick-up surface abuts on the light-emitting surface side of a VCSEL device.

However, the light-emitting portion of a VCSEL device is prone to crystal loss due to impact, and hence use of a flat collet as the die collet DC has the following problem. That is, there is a risk of the die collet DC coming into contact with this light-emitting portion, causing damage to the VCSEL device.

Accordingly, it is an object of the present disclosure to provide a vertical-cavity surface-emitting laser (VCSEL) device and a VCSEL array device which are not susceptible to damage when mounting a mounting type VCSEL device on the mounting circuit board.

Solution to Problem

A vertical-cavity surface-emitting laser device according to the present disclosure has the following characteristic features. The vertical-cavity surface-emitting laser device includes a base substrate, an N-type semiconductor multilayer reflecting layer, an active layer including a quantum well, and a P-type semiconductor multilayer reflecting layer that are formed on a surface of the base substrate, an anode electrode that is connected to the P-type semiconductor multilayer reflecting layer, and a cathode electrode that is connected to the N-type semiconductor multilayer reflecting layer. The vertical-cavity surface-emitting laser device has a light-emitting-region multilayer portion that emits laser light. The light-emitting-region multilayer portion is narrower than the base substrate when viewed from the direction of the surface of the base substrate and including at least the layers from the N-type semiconductor multilayer reflecting layer upwards. The vertical-cavity surface-emitting laser device is to be mounted onto an external circuit board by sucking the vertical-cavity surface-emitting laser device from the side of the base substrate where the light-emitting-region multilayer portion is located. When viewed from the direction of the surface of the base substrate, a region where the light-emitting-region multilayer portion is formed, and a suction region that is subject to the sucking are located at different positions.

This configuration makes it possible to prevent the suction jig from coming into contact with the light-emitting-region multilayer portion formed by stacking a plurality of semiconductor layers, when the vertical-cavity surface-emitting laser device is sucked by the suction jig.

Further, the vertical-cavity surface-emitting laser device according to the present disclosure is preferably configured as follows. The base substrate has a first length along a first direction, and a second length along a second direction that is substantially perpendicular to the first direction. The first direction is longer than the second length. If the suction region is substantially equal in size to the second length in both the first direction and the second direction, the region in which the light-emitting-region multilayer portion is formed is located at a predetermined position along the first direction with respect to the suction region, so as to be in contact with or spaced from the suction region.

This configuration represents a more specific structure of the vertical-cavity surface-emitting laser device. Normally, when mounting a mounting-type component, in particular, a mounting-type component that has a small outer shape and is mounted from the bottom side like the vertical-cavity surface-emitting laser device according to the present disclosure, the component is generally mounted by sucking the component from its surface side. At this time, to improve suction performance, the suction surface of a collet serving as the suction jig is set so that the suction surface abuts on the surface of the vertical-cavity surface-emitting laser device as much as possible and is not larger than the outer shape of the vertical-cavity surface-emitting laser device.

Accordingly, if the length along the second direction (second length) is shorter than the length along the first direction (first length), the suction performance improves when the second length is made equal to be length of the suction surface of the collet serving as the suction jig.

When the above-mentioned configuration is adopted in this case, it is possible to prevent the collet from coming into contact with the light-emitting-region multilayer portion, even when the entire suction surface of the collet is made to abut on the surface of the vertical-cavity surface-emitting laser device.

Further, the vertical-cavity surface-emitting laser device according to the present disclosure is preferably configured as follows. The vertical-cavity surface-emitting laser device includes an anode pad electrode and a cathode pad electrode. The anode pad electrode is formed on the side of the base substrate where the light-emitting-region multilayer portion is located, and the anode pad electrode is connected to the anode electrode. The cathode pad electrode is formed on the side of the base substrate where the light-emitting-region multilayer portion is located, and the cathode pad electrode is connected to the cathode electrode. The anode pad electrode and the cathode pad electrode are disposed on the same side along the second direction with respect to the light-emitting-region multilayer portion.

According to this configuration, the anode pad electrode and the cathode pad electrode are disposed on the same side with respect to the light-emitting region. Accordingly, when connecting to an external circuit board by wire bonding using the anode pad electrode and the cathode pad electrode, if wires are bonded in a direction away from the light-emitting region in the same manner for both the anode pad electrode and the cathode pad electrode, it is possible to prevent the wires from overlapping the light-emitting region in plan view, thus preventing the laser light from impinging on the wires.

Further, the anode pad electrode and the cathode pad electrode of the vertical-cavity surface-emitting laser device according to the present disclosure may be arrayed along the first direction.

This configuration represents a specific example of how the anode pad electrode and the cathode pad electrode are disposed.

Further, in the vertical-cavity surface-emitting laser device according to the present disclosure, the cathode pad electrode may include two cathode pad electrodes, and the two cathode pad electrodes may be positioned so as to sandwich the anode pad electrode when viewed from the direction of the surface of the base substrate.

This configuration also represents a specific example of how the anode pad electrode and the cathode pad electrode are disposed.

Further, in the vertical-cavity surface-emitting laser device according to the present disclosure, the spacing between the anode pad electrode and the cathode pad electrode along the first direction is preferably constant.

This configuration makes the spacing of the wire-bond positions on the vertical-cavity surface-emitting laser device constant. As a result, the wire bond process and the wire bond setting process can be simplified.

A vertical-cavity surface-emitting laser array device according to the present disclosure includes a plurality of the vertical-cavity surface-emitting laser devices according to any one of the above-mentioned configurations, and the light-emitting-region multilayer portions of the vertical-cavity surface-emitting laser devices are spaced a predetermined distance from each other.

This configuration represents a configuration example of a vertical-cavity surface-emitting laser array device in which a plurality of the vertical-cavity surface-emitting laser devices mentioned above are arrayed. As described above, the vertical-cavity surface-emitting laser devices are arrayed in a highly reliable manner that does not cause failure. Consequently, the vertical-cavity surface-emitting laser array device obtained as a result is also highly reliable and free from failure.

Advantageous Effects of Disclosure

According to the present disclosure, the vertical-cavity surface-emitting device can be mounted in such a way that significantly reduces the risk of being damaged at manufacture, and ensures that laser light is emitted from the vertical-cavity surface-emitting device in a direction perpendicular to the mounting circuit board. This makes it possible to realize an electronic component equipped with a highly reliable vertical-cavity surface-emitting device.

DETAILED DESCRIPTION

A vertical-cavity surface-emitting laser device (VCSEL device) according to a first embodiment of the present disclosure will be described with reference to the drawings. Hereinafter, a vertical-cavity surface-emitting laser device will be referred to as "VCSEL device".

Figure 1:
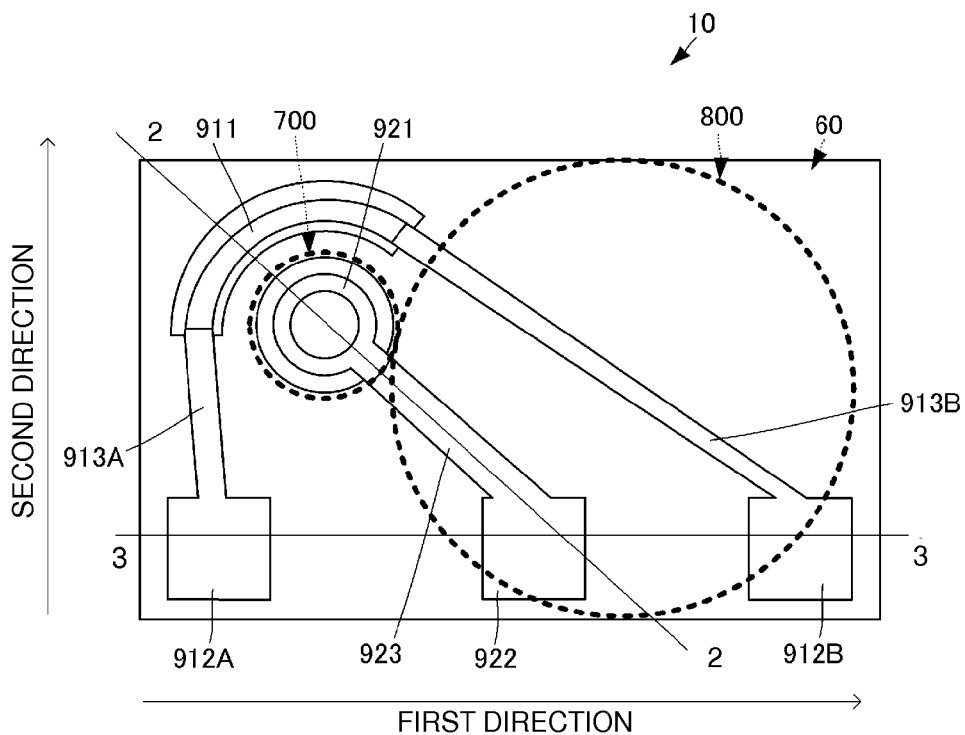
FIG. 1 is a plan view of a VCSEL device 10 according to a first embodiment of the present disclosure.
Figure 2:
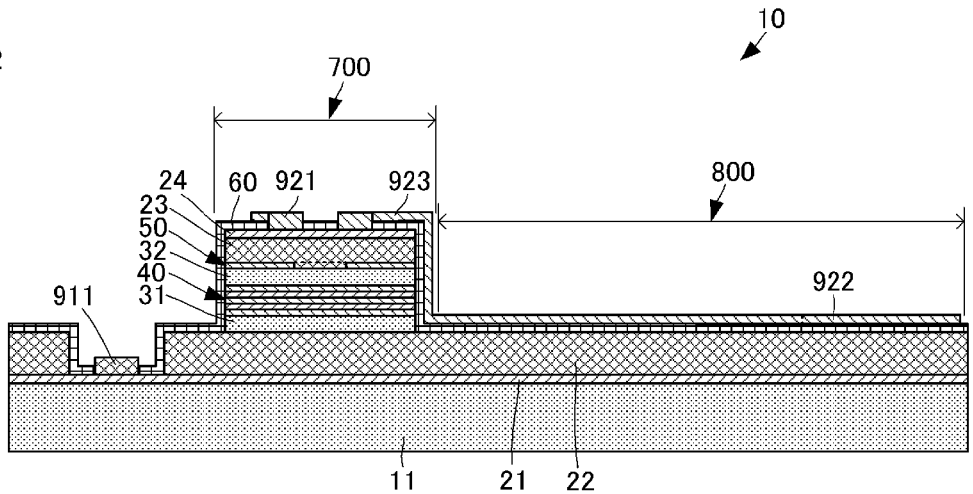
FIG. 2 is a sectional view along a line 2-2 of the VCSEL device 10 according to the first embodiment of the present disclosure.
Figure 3:
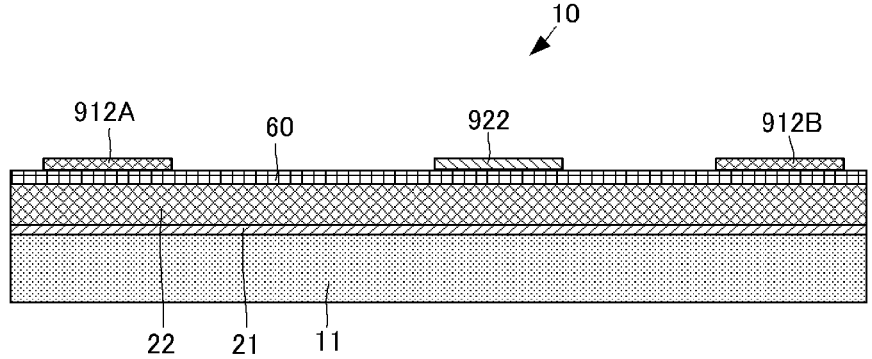
FIG. 3 is a sectional view along a line 3-3 of the VCSEL device 10 according to the first embodiment of the present disclosure.

FIG. 1 is a plan view of a VCSEL device 10 according to a first embodiment of the present disclosure. FIG. 2 is a sectional view along a line 2-2 of the VCSEL device 10 according to the first embodiment of the present disclosure. FIG. 3 is a sectional view along a line 3-3 of the VCSEL device 10 according to the first embodiment of the present disclosure.

The VCSEL device 10 is formed from a hetero-junction semiconductor having the structure illustrated in FIGS. 1, 2, and 3. The VCSEL device 10 includes a base substrate 11 made of a GaAs material.

The base substrate 11 is formed from a semi-insulating semiconductor or an N-type conductivity semiconductor. For example, specifically, the base substrate 11 is formed by a substrate made of a GaAs material. When the base substrate 11 is formed as a semi-insulating semiconductor substrate, the base substrate 11 preferably has a resistivity of $1.0 \times 10^7$ Ω·cm or more. By using the base substrate 11 formed from a semi-insulating semiconductor with such a resistivity, when arraying a plurality of VCSEL devices on a single base substrate as will be described later, higher isolation can be achieved between the VCSEL devices.

The base substrate 11 has a rectangular shape when viewed from a direction perpendicular to the base substrate 11, that is, from its surface side (i.e., in plan view). A length (first length) along a first direction of the base substrate 11 having a rectangular shape is longer than a length (second length) along a second direction perpendicular to the first direction.

An N-type semiconductor contact layer 21 is stacked on the surface of the base substrate 11. The N-type semiconductor contact layer 21 is formed from a compound semiconductor having an N-type conductivity.

An N-type distributed Bragg reflector (DBR) layer 22 is staked on the surface of the N-type semiconductor contact layer 21. The N-type semiconductor DBR layer 22 is made of an AlGaAs material. The N-type semiconductor DBR layer 22 is formed by stacking a plurality of layers that differ in the composition ratio of Al to Ga. This layer configuration provides a first reflector for generating laser light at a predetermined frequency. The N-type semiconductor DBR layer may double as an N-type semiconductor contact layer. That is, the N-type semiconductor contact layer may not necessarily be provided.

An N-type semiconductor clad layer 31 is stacked on the surface of the N-type semiconductor DBR layer 22. The N-type semiconductor clad layer 31 is formed on a part of the N-type semiconductor DBR layer 22 which becomes a light-emitting region described later. In other words, in plan view of the base substrate 11, the N-type semiconductor clad layer 31 is formed only on a part of the N-type semiconductor DBR layer 22. The N-type semiconductor clad layer 31 is also made of an AlGaAs material.

Active layers 40 are formed on the surface of the N-type semiconductor clad layer 31. The active layers 40 include layers made of GaAs and AlGaAs materials. The AlGaAs layers serve as optical confinement layers with a large band gap, with a GaAs layer being sandwiched between the optical confinement layers. With this configuration, the active layers 40 include a layer having a single or a plurality of quantum wells sandwiched between the optical confinement layers with a large band gap.

A P-type semiconductor clad layer 32 is formed on the surface of the active layers 40. The P-type semiconductor clad layer 32 is also made of an AlGaAs material.

A P-type semiconductor DBR layer 23 is formed on the surface of the P-type semiconductor clad layer 32. The P-type semiconductor DBR layer 23 is made of an AlGaAs material. The P-type semiconductor DBR layer 23 is formed by stacking a plurality of layers that differ in the composition ratio of Al to Ga. This layer configuration forms a second reflector for generating laser light at a predetermined frequency. The P-type semiconductor DBR layer 23 is formed so as to have a reflectivity slightly lower than that of the N-type semiconductor DBR layer 22. While the semiconductor clad layers are provided so as to sandwich the active layers in this example, the present disclosure is not limited to this configuration. The active layers may be provided with a layer with a film thickness that causes resonance.

An oxide constriction layer 50 is formed at the interface between the P-type semiconductor clad layer 32 and the P-type semiconductor DBR layer 23. The oxide constriction layer 50 is made of an AlGaAs material, and has a higher composition ratio of Al to Ga than other layers. The oxide constriction layer 50 is not provided over the entire interface between the P-type semiconductor clad layer 32 and the P-type semiconductor DBR layer 23. A portion where the oxide constriction layer 50 is not provided exists over a predetermined area substantially in the middle of the interface region where the oxide constriction layer 50 is to be formed.

A P-type semiconductor contact layer 24 is formed on the surface of the P-type semiconductor DBR layer 23. The P-type semiconductor contact layer 24 is formed from a compound semiconductor having a P-type conductivity. The P-type semiconductor DBR layer may double as a P-type semiconductor contact layer. That is, the P-type semiconductor contact layer may not necessarily be provided.

The N-type semiconductor DBR layer 22, the N-type semiconductor clad layer 31, the active layers 40, the P-type semiconductor clad layer 32, the P-type semiconductor DBR layer 23, and the P-type semiconductor contact layer 24 mentioned above form a "light-emitting-region multilayer portion" according to the present disclosure. A region on the base substrate 11 where this light-emitting-region multilayer portion is formed becomes a light-emitting region 700. The laser light is emitted in this light-emitting-region multilayer portion.

With the above-mentioned configuration, the thicknesses of individual layers and the composition ratios of Al to Ga in these layers are set so that a plurality of quantum wells having a single emission spectrum peak wave length are positioned at the antinode at the center of the distribution of optical standing waves. Consequently, the light-emitting-region multilayer portion functions as the light-emitting portion of the VCSEL device 10. Furthermore, the inclusion of the oxide constriction layer 50 mentioned above allows for efficient injection of current into the active region, and also provides a lens effect, thus realizing a VCSEL device with low power consumption.

An anode electrode 921 is formed on the surface of the P-type semiconductor contact layer 24. As illustrated in FIG. 1, the anode electrode 921 is an annular electrode in plan view. The anode electrode may not necessarily have an annular shape. For example, the anode electrode may have a C-shape with a part of an annular shape being open, or a rectangular shape.

The surface of the N-type semiconductor contact layer 21 has a region where the N-type semiconductor DBR layer 22 is not formed. This region is located in close proximity to the light-emitting region 700.

A cathode electrode 911 is formed in this region. The cathode electrode 911 is formed so as to be in electrical continuity with the N-type semiconductor contact layer 21. As illustrated in FIG. 1, the cathode electrode 911 is an electrode having such an arc shape that extends along the outer shape of the light-emitting region 700 in plan view.

An insulating film 60 is formed on the same side as the surface of the base substrate 11 in such a way that the insulating film 60 does not cover the cathode electrode 911 and the anode electrode 921 at least partially, and covers the outer surface of the stack of other components that form the light-emitting-region multilayer portion. The insulating film is formed of, for example, a silicon nitride (SiNx) material.

Cathode pad electrodes 912A and 912B, and an anode pad electrode 922 are formed on the surface of the insulating film 60 so as to be spaced from each other. The cathode pad electrodes 912A and 912B, and the anode pad electrode 922 are located on regions on the surface of the insulating film 60 which do not overlap the light-emitting region 700.

The cathode pad electrode 912A is connected to the cathode electrode 911 via a cathode wiring electrode 913A. The cathode pad electrode 912B is connected to the cathode electrode 911 via a cathode wiring electrode 913B. The anode pad electrode 922 is connected to the anode electrode 921 via an anode wiring electrode 923.

As illustrated in FIG. 1, the light-emitting region 700 of the VCSEL device 10 according to the first embodiment is positioned near one end along the first direction. The light-emitting region 700 is also positioned near one end along the second direction.

Specifically, this position is determined on the basis of the following specification. The VCSEL device 10 is a mounting-type component. As described above, the VCSEL device 10 is picked up by causing a flat collet serving as a suction jig to suck onto the surface of the VCSEL device 10, that is, the uppermost surface of the stack of layers formed on the base substrate 11. Then, the VCSEL device 10 is mounted to a predetermined position on an external circuit board.

Normally, for improved suction performance, a flat collet is preferably sized as close as possible to the size of the portion of the VCSEL device 10 which can be sucked. Conversely, if the flat collet is sized larger than the outer shape of the VCSEL device 10, its suction performance decreases. That is, for example, when using a flat collect with a circular suction surface, it is desirable to make the diameter of the suction surface equal to the shorter one of the first and second lengths of the base substrate 11, that is, the second length in the case of the configuration according to the first embodiment. Therefore, for the VCSEL device 10 as described above according to the first embodiment, a flat collect whose suction surface has a diameter equal to the second length is used. Accordingly, as illustrated in FIG. 1, a suction region 800 is a circular region that makes contact with the sides of the base substrate 11 at the opposite ends of the second direction, and makes contact with the side of the base substrate 11 at the other end of the first direction.

According to the present disclosure, the light-emitting region 700 is disposed so as not to overlap the suction region 800 that is set in this way. That is, with respect to the first direction, the light-emitting region 700 is positioned closer to the one end of the first direction than is the suction region 800, in such a way that the light-emitting region 700 is substantially in contact with or spaced a predetermined distance from the suction region 800. The light-emitting region 700 and the suction region 800 are preferably spaced a predetermined distance from each other. As for the distance of their spacing at this time, on the basis of the accuracy of the pick-up of the VCSEL device 10 by the flat collet, the light-emitting region 700 is preferably located outside the range of placement errors of the flat collet.

This configuration ensures that the flat collet does not overlap the light-emitting region 700 when the flat collet sucks the VCSEL device 10. Accordingly, the flat collet does not contact the light-emitting-region multilayer portion, preventing crystal loss in the light-emitting-region multilayer portion.

As illustrated in FIG. 1, also with respect to the second direction, the light-emitting region 700 can be positioned closer to the one end of the second direction than is the suction region 800, in such a way that the light-emitting region 700 is substantially in contact with or spaced a predetermined distance from the suction region 800. Therefore, as compared with when the light-emitting region 700 and the suction region 800 lie side by side along the first direction, the light-emitting region 700 and the suction region 800 can be made to occupy a shorter length along the first direction on the base substrate 11. As a result, the length along the first direction of the base substrate 11 can be shortened, allowing further miniaturization of the VCSEL device 10.

The cathode pad electrodes 912A and 912B, and the anode pad electrode 922 are disposed near the one end of the second direction, with a predetermined spacing along the first direction. The cathode pad electrodes 912A and 912B, and the anode pad electrode 922 are disposed on the same side with respect to the light-emitting region 700 in this way for the following reason. That is, when it is desired to make a wire bond connection to an external circuit board from one end side of the second direction, all the wires do not pass over the light-emitting region 700. This prevents loss of laser light that occurs when the laser light emitted from the light-emitting region 700 in a direction perpendicular to the base substrate 11 is reflected by the wires. Furthermore, when disposing these pad electrodes with a predetermined spacing along the first direction, making this spacing constant ensures that the spacing of wire-bond land positions on the VCSEL device 10 becomes constant. Therefore, the wire bond process and the wire bond setting configuration can be simplified, allowing reduction of workload. Furthermore, constraints on wire bonding accuracy determine the minimum size and minimum spacing of the pad electrodes. Accordingly, by disposing the pad electrodes with a constant spacing determined by the minimum size and the minimum spacing, the chip size can be reduced.

The anode pad electrode 922 is disposed between the cathode pad electrode 912A and the cathode pad electrode 912B. With this configuration, when placing a plurality of the VCSEL devices 10 so as to be arrayed along the first direction, adjacent pad electrodes are at the same polarity between adjacent VCSEL devices 10. Therefore, cross talk between driving signals applied to individual VCSEL devices 10 can be suppressed.

Figure 4:
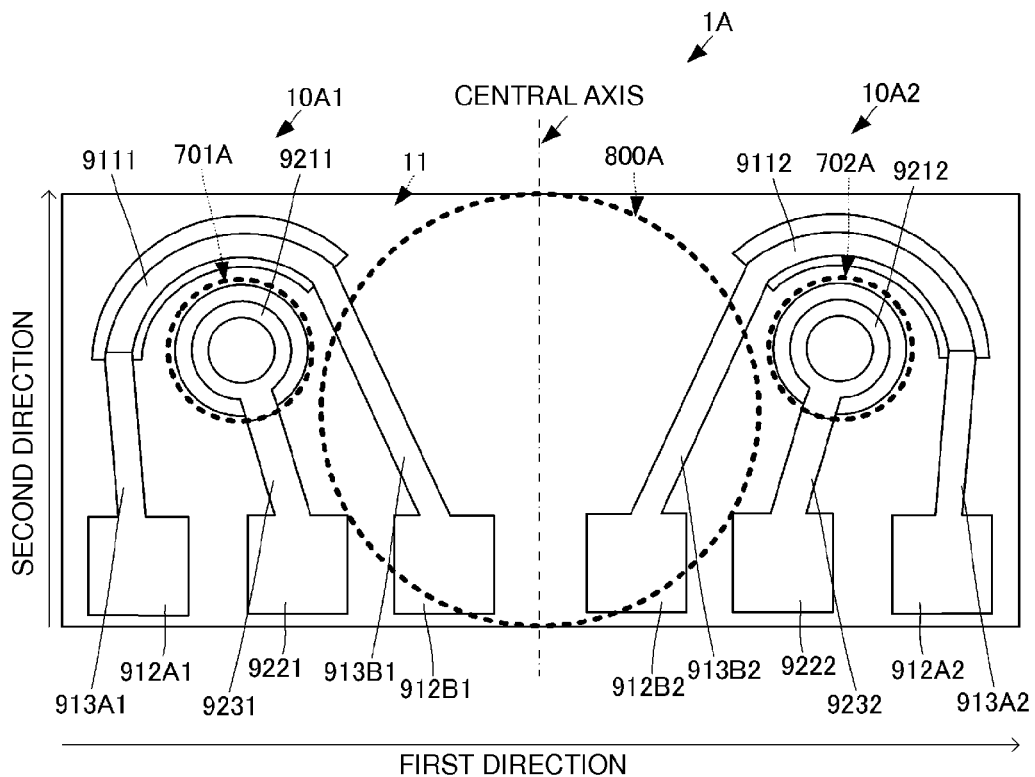
FIG. 4 is a plan view of a VCSEL array device 1A according to a second embodiment of the present disclosure.

Next, a vertical-cavity surface-emitting laser array device according to a second embodiment will be described with reference to the drawings. Hereinafter, a vertical-cavity surface-emitting laser array device will be referred to as "VCSEL array device". FIG. 4 is a plan view of a VCSEL array device 1A according to the second embodiment of the present disclosure.

The VCSEL array device 1A according to the second embodiment has VCSEL devices 10A1 and 10A2 formed on a single base substrate. The VCSEL devices 10A1 and 10A2 are of the same multilayer stack structure as the VCSEL device 10 according to the first embodiment mentioned above. Therefore, a description of the structure of the VCSEL devices 10A1 and 10A2 along the stacking direction will be omitted.

The VCSEL devices 10A1 and 10A2 are disposed with a predetermined spacing along the first direction of the base substrate. The shapes of the VCSEL device 10A1 and VCSEL device 10A2 are substantially line-symmetric in plan view with respect to a central axis located substantially in the middle along the first direction of the base substrate 11 and extending along the second direction.

Specifically, a cathode electrode 9111 of the VCSEL device 10A1, and a cathode electrode 9112 of the VCSEL device 10A2 are line-symmetric with respect to the above-mentioned central axis. Cathode pad electrodes 912A1 and 912B1 of the VCSEL device 10A1, and cathode pad electrodes 912A2 and 912B2 of the VCSEL device 10A2 are respectively line-symmetric with respect to the above-mentioned central axis. Cathode wiring electrodes 913A1 and 913B1 of the VCSEL device 10A1, and cathode wiring electrodes 913A2 and 913B2 of the VCSEL device 10A2 are respectively line-symmetric with respect to the above-mentioned central axis.

An anode electrode 9211 of the VCSEL device 10A1, and an anode electrode 9212 of the VCSEL device 10A2 are line-symmetric with respect to the above-mentioned central axis. An anode pad electrode 9221 of the VCSEL device 10A1, and an anode pad electrode 9222 of the VCSEL device 10A2 are line-symmetric with respect to the above-mentioned central axis. An anode wiring electrode 9231 of the VCSEL device 10A1, and an anode wiring electrode 9232 of the VCSEL device 10A2 are line-symmetric with respect to the above-mentioned central axis.

A light-emitting region 701A of the VCSEL device 10A1, and a light-emitting region 702A of the VCSEL device 10A2 are line-symmetric with respect to the above-mentioned central axis.

As in the first embodiment mentioned above, a suction region 800A is a region onto which the flat collet sucks. The diameter of the suction region 800A is substantially equal to the second length of the VCSEL array device 1A. When the flat collet having such a shape is to be placed over the VCSEL array device 1A so that the center of the flat collect is aligned with the center of the first direction and the center of the second direction of the VCSEL array device 1A, as illustrated in FIG. 4, a region not included in the suction region 800A is created at either end of the first direction.

Accordingly, as illustrated in FIG. 4, the VCSEL devices 10A1 and 10A2 are arrayed along the first direction in such a way that the light-emitting region 701A and the light-emitting region 702A are not included in the suction region 800A and are line-symmetric with respect to the above-mentioned central axis, thereby preventing damage to the VCSEL devices 10A1 and 10A2 at a mounting as in the first embodiment.

In the second embodiment as well, the cathode pad electrodes and the anode pad electrodes are disposed on the same side with respect to the light-emitting regions 701A and 702A. Therefore, as in the first embodiment, loss of laser light due to wires can be prevented.

While FIG. 4 is directed to the case where the VCSEL devices 10A1 and 10A2 are precisely line-symmetric with respect to the central axis, the VCSEL devices 10A1 and 10A2 may not necessarily be precisely line-symmetric. It suffices that the VCSEL devices 10A1 and 10A2 be arrayed along the first direction in such a way that the light-emitting region 701A and the light-emitting region 702A are not included in the suction region 800A.

Figure 5:
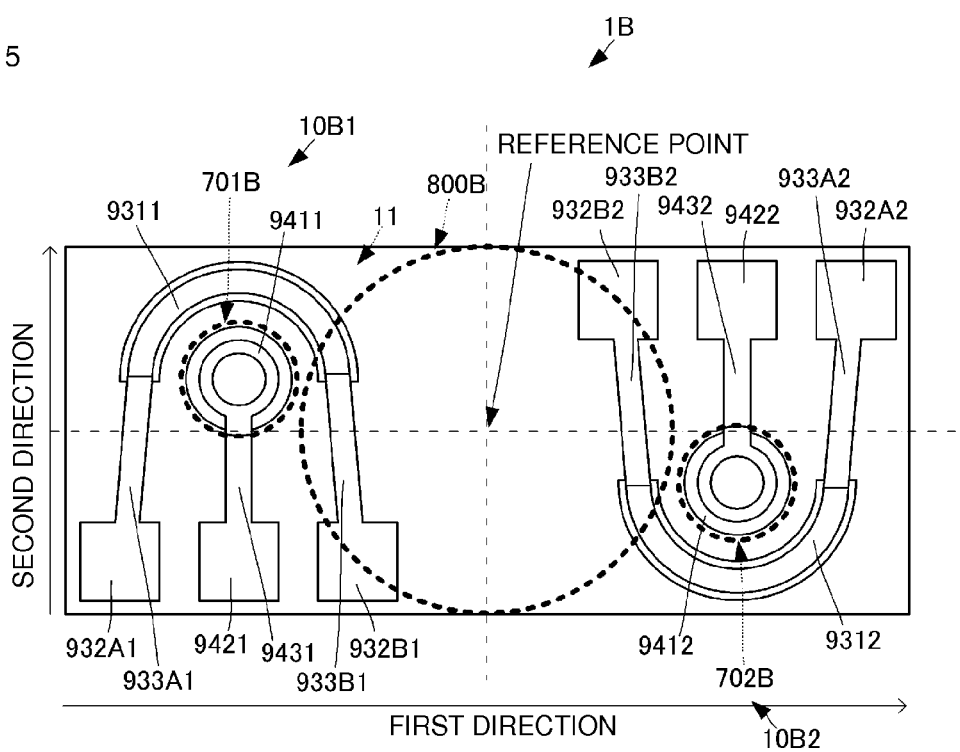
FIG. 5 is a plan view of a VCSEL array device 1B according to a third embodiment of the present disclosure.

Next, a vertical-cavity surface-emitting laser array device according to a third embodiment will be described with reference to the drawings. In the third embodiment as well, hereinafter, a vertical-cavity surface-emitting laser array device will be referred to as "VCSEL array device". FIG. 5 is a plan view of a VCSEL array device 1B according to the third embodiment of the present disclosure.

The VCSEL array device 1B according to the third embodiment has VCSEL devices 10B1 and 10B2 formed on a single base substrate. The VCSEL devices 10B1 and 10B2 are of the same multilayer stack structure as the VCSEL device 10 according to the first embodiment mentioned above, and differ from the VCSEL device 10 in their anode and cathode wiring pattern. Therefore, a description of the structure of the VCSEL devices 10B1 and 10B2 along the stacking direction will be omitted.

The VCSEL devices 10B1 and 10B2 are disposed with a predetermined spacing along the first direction of the base substrate. The shapes of the VCSEL device 10B1 and VCSEL device 10B2 are substantially point-symmetric in plan view with respect to a reference point located substantially in the middle along the first direction of the base substrate 11 and in the middle along the second direction.

Specifically, a cathode electrode 9311 of the VCSEL device 10B1, and a cathode electrode 9312 of the VCSEL device 10B2 are point-symmetric with respect to the above-mentioned reference point. Cathode pad electrodes 932A1 and 932B1 of the VCSEL device 10B1, and cathode pad electrodes 932A2 and 932B2 of the VCSEL device 10B2 are respectively point-symmetric with respect to the above-mentioned reference point. Cathode wiring electrodes 933A1 and 933B1 of the VCSEL device 10B1, and cathode wiring electrodes 933A2 and 933B2 of the VCSEL device 10B2 are respectively point-symmetric with respect to the above-mentioned reference point.

An anode electrode 9411 of the VCSEL device 10B1, and an anode electrode 9412 of the VCSEL device 10B2 are point-symmetric with respect to the above-mentioned reference point. An anode pad electrode 9421 of the VCSEL device 10B1, and an anode pad electrode 9422 of the VCSEL device 10B2 are point-symmetric with respect to the above-mentioned reference point. An anode wiring electrode 9431 of the VCSEL device 10B1, and an anode wiring electrode 9432 of the VCSEL device 10B2 are point-symmetric with respect to the above-mentioned reference point.

A light-emitting region 701B of the VCSEL device 10B1, and a light-emitting region 702B of the VCSEL device 10B2 are point-symmetric with respect to the above-mentioned reference point.

As in the first embodiment mentioned above, a suction region 800B is a region onto which the flat collet sucks. The diameter of the suction region 800B is substantially equal to the second length of the VCSEL array device 1B. When the flat collet having such a shape is to be placed over the VCSEL array device 1B so that the center of the flat collect is aligned with the center of the first direction and the center of the second direction of the VCSEL array device 1B, as illustrated in FIG. 5, a region not included in the suction region 800B is created at either end of the first direction.

Accordingly, as illustrated in FIG. 5, the VCSEL devices 10B1 and 10B2 are arrayed along the first direction in such a way that the light-emitting region 701B and the light-emitting region 702B are not included in the suction region 800B and are point-symmetric with respect to the above-mentioned reference point, thereby preventing damage to the VCSEL devices 10B1 and 10B2 at a mounting as in the first, second, and third embodiments.

In the third embodiment, the direction in which the cathode pad electrodes and the anode pad electrode of the VCSEL device 10B1 are located with respect to the light-emitting region 701B, and the direction in which the cathode pad electrodes and each anode pad electrode of the VCSEL device 10B2 are located with respect to the light-emitting region 702B are opposite. However, if wire bonding is performed on the side opposite to the light-emitting regions 701B and 702B for each of the VCSEL devices 10B1 and 10B2, respectively, loss of laser light due to wires can be prevented as in the first, second, and third embodiments.

While FIG. 5 is directed to the case where the VCSEL devices 10B1 and 10B2 are precisely point-symmetric with respect to the reference point, the VCSEL devices 10B1 and 10B2 may not necessarily be precisely line-symmetric. It suffices that the VCSEL devices 10B1 and 10B2 be arrayed along the first direction in such a way that the light-emitting region 701B and the light-emitting region 702B are not included in the suction region 800B.

Figure 6:
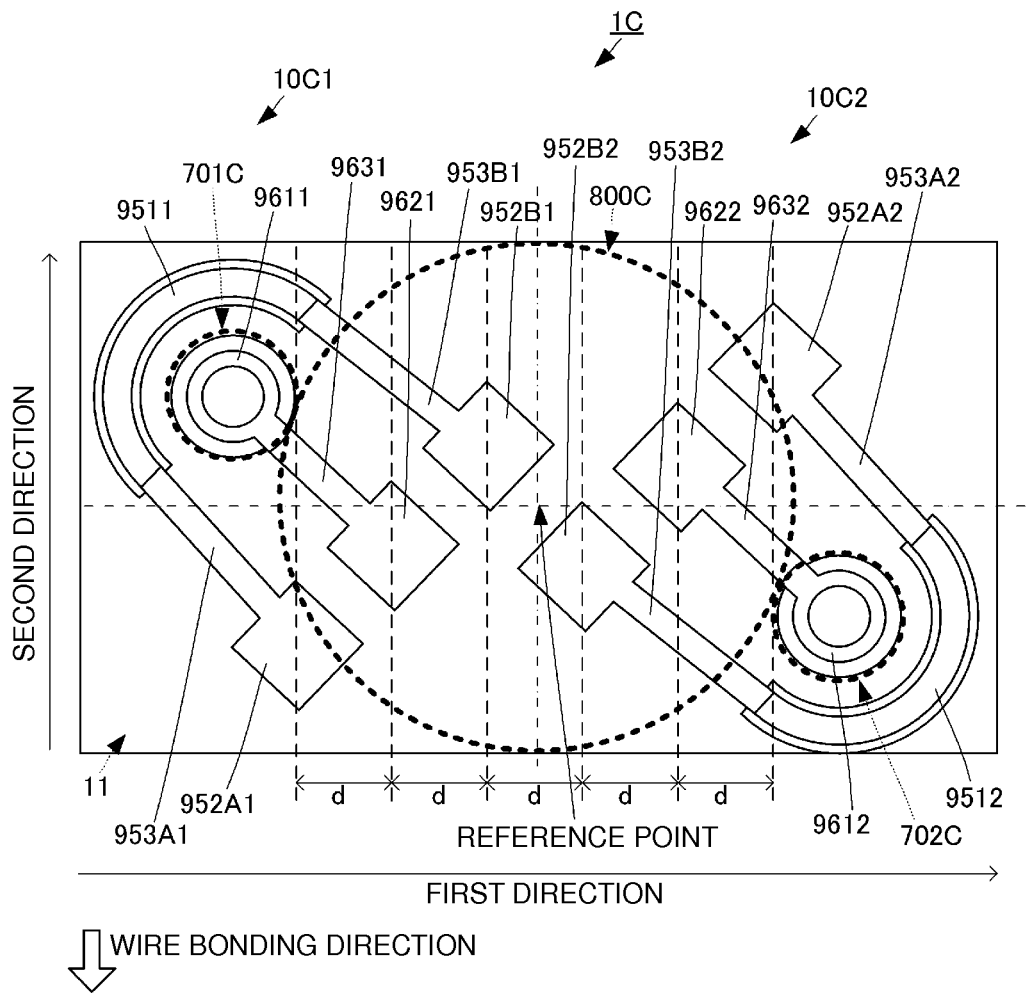
FIG. 6 is a plan view of a VCSEL array device 1C according to a fourth embodiment of the present disclosure.

Next, a vertical-cavity surface-emitting laser array device according to a fourth embodiment will be described with reference to the drawings. In the fourth embodiment as well, hereinafter, a vertical-cavity surface-emitting laser array device will be referred to as "VCSEL array device". FIG. 6 is a plan view of a VCSEL array device 1C according to the fourth embodiment of the present disclosure.

The VCSEL array device 1C according to the fourth embodiment has VCSEL devices 10C1 and 10C2 formed on a single base substrate. The VCSEL devices 10C1 and 10C2 are of the same multilayer stack structure as the VCSEL device 10 according to the first embodiment mentioned above, and differ from the VCSEL device 10 in their anode and cathode wiring pattern. Therefore, a description of the structure of the VCSEL devices 10C1 and 10C2 along the stacking direction will be omitted.

The VCSEL devices 10C1 and 10C2 are disposed with a predetermined spacing along the first direction of the base substrate. The shapes of the VCSEL device 10C1 and VCSEL device 10C2 are substantially point-symmetric in plan view with respect to a reference point located substantially in the middle along the first direction of the base substrate 11 and in the middle along the second direction.

Specifically, a cathode electrode 9511 of the VCSEL device 10C1, and a cathode electrode 9512 of the VCSEL device 10C2 are point-symmetric with respect to the above-mentioned reference point. Cathode pad electrodes 952A1 and 952B1 of the VCSEL device 10C1, and cathode pad electrodes 952A2 and 952B2 of the VCSEL device 10C2 are respectively point-symmetric with respect to the above-mentioned reference point. Cathode wiring electrodes 953A1 and 953B1 of the VCSEL device 10C1, and cathode wiring electrodes 953A2 and 953B2 of the VCSEL device 10C2 are respectively point-symmetric with respect to the above-mentioned reference point.

An anode electrode 9611 of the VCSEL device 10C1, and an anode electrode 9612 of the VCSEL device 10C2 are point-symmetric with respect to the above-mentioned reference point. An anode pad electrode 9621 of the VCSEL device 10C1, and an anode pad electrode 9622 of the VCSEL device 10C2 are point-symmetric with respect to the above-mentioned reference point. An anode wiring electrode 9631 of the VCSEL device 10C1, and an anode wiring electrode 9632 of the VCSEL device 10C2 are point-symmetric with respect to the above-mentioned reference point.

The cathode pad electrodes 952A1 and 952B1 and the anode pad electrode 9621 of the VCSEL 10C1 are arrayed along a direction that is not parallel but has a predetermined angle with respect to each of the first and second directions. The cathode pad electrodes 952A2 and 952B2 and the anode pad electrode 9622 of the VCSEL 10C2 are arrayed along a direction that is not parallel but has a predetermined angle with respect to each of the first and second directions. The direction in which the cathode pad electrodes 952A2 and 952B2 and the anode pad electrode 9622 of the VCSEL 10C2 are arrayed, and the direction in which the cathode pad electrodes 952A1 and 952B1 and the anode pad electrode 9621 of the VCSEL 10C1 are arrayed are parallel to each other.

The cathode pad electrodes 952A1 and 952B1, the anode pad electrode 9621, the cathode pad electrodes 952A2 and 952B2, and the anode pad electrode 9622 are disposed with an equal spacing d along the first direction.

With this configuration, when performing wire bonding so as to extend the wires along the second direction, the spacing of wire-bond land positions on the VCSEL devices 10C1 and 10C2 becomes constant. Therefore, the wire bond process and the wire bond setting configuration can be simplified, allowing reduction of workload. Furthermore, constraints on wire bonding accuracy determine the minimum size and minimum spacing of the pad electrodes. Accordingly, by disposing the pad electrodes with a constant spacing determined by the minimum size and the minimum spacing, the chip size can be reduced.

A light-emitting region 701C of the VCSEL device 10C1, and a light-emitting region 702C of the VCSEL device 10C2 are point-symmetric with respect to the above-mentioned reference point.

As in the first embodiment mentioned above, a suction region 800C is a region onto which the flat collet sucks. The diameter of the suction region 800C is substantially equal to the second length of the VCSEL array device 1C. When the flat collet having such a shape is to be placed over the VCSEL array device 1C so that the center of the flat collect is aligned with the center of the first direction and the center of the second direction of the VCSEL array device 1C, as illustrated in FIG. 6, a region not included in the suction region 800C is created at either end of the first direction.

Accordingly, as illustrated in FIG. 6, the VCSEL devices 10C1 and 10C2 are arrayed along the first direction in such a way that the light-emitting region 701C and the light-emitting region 702C are not included in the suction region 800C and are point-symmetric with respect to the above-mentioned reference point, thereby preventing damage to the VCSEL devices 10C1 and 10C2 at a mounting as in the first and second embodiments.

In the VCSEL array device 1C according to the fourth embodiment, the cathode pad electrodes 952A1 and 952B1, and the anode pad electrode 9621 of the VCSEL device 10C1, and the cathode pad electrodes 952A2 and 952B2, and the anode pad electrode 9622 of the VCSEL device 10C2 are positioned along the first directions so as not to overlap the light-emitting regions 701C and 702C, respectively. Therefore, when performing wire bonding so as to extend the wires along the second direction or the backward direction thereof, laser light does not impinge on the wires, preventing loss of the laser light due to the wires.

While FIG. 6 is directed to the case where the VCSEL devices 10C1 and 10C2 are precisely point-symmetric with respect to the reference point, the VCSEL devices 10C1 and 10C2 may not necessarily be precisely line-symmetric. It suffices that the VCSEL devices 10C1 and 10C2 be arrayed along the first direction in such a way that the light-emitting region 701C and the light-emitting region 702C are not included in the suction region 800C.

Figure 7:
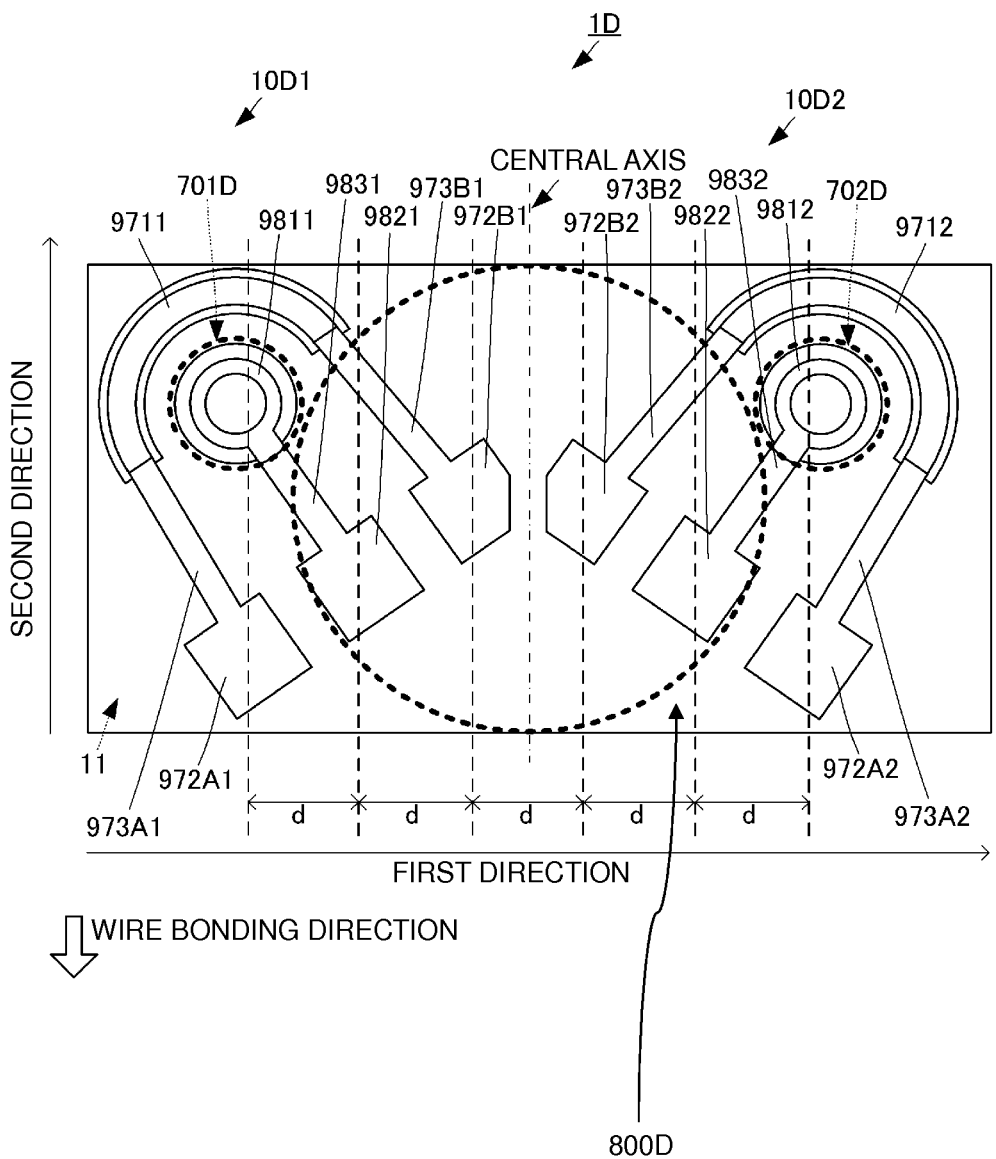
FIG. 7 is a plan view of a VCSEL array device 1D according to a fifth embodiment of the present disclosure.
Figure 8A:
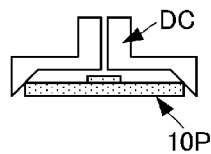
FIGS. 8(A) through 8(D) illustrate a problem that arises when mounting a conventional VCSEL device on a mounting circuit board.
Figure 8B:
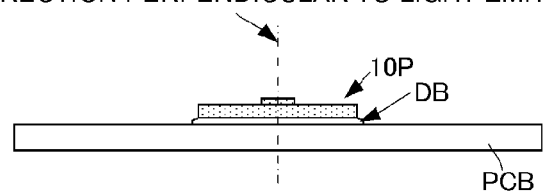
Figure 8C:
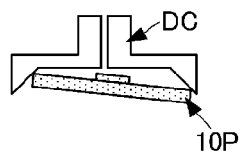
Figure 8D:
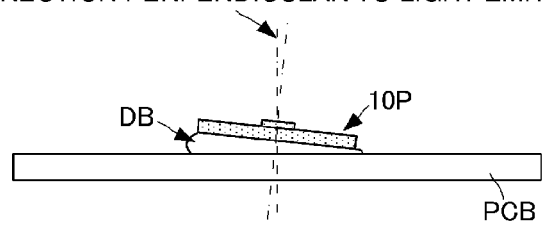

Next, a vertical-cavity surface-emitting laser array device according to a fifth embodiment will be described with reference to the drawings. In the fifth embodiment as well, hereinafter, a vertical-cavity surface-emitting laser array device will be referred to as "VCSEL array device". FIG. 7 is a plan view of a VCSEL array device 1D according to the fifth embodiment of the present disclosure.

The VCSEL array device 1D according to the fifth embodiment has VCSEL devices 10D1 and 10D2 formed on a single base substrate. The VCSEL devices 10D1 and 10D2 are of the same multilayer stack structure as the VCSEL device 10 according to the first embodiment mentioned above, and differ from the VCSEL device 10 in their anode and cathode wiring pattern. Therefore, a description of the structure of the VCSEL devices 10D1 and 10D2 along the stacking direction will be omitted.

The VCSEL devices 10D1 and 10D2 are disposed with a predetermined spacing along the first direction of the base substrate. The shapes of the VCSEL device 10D1 and VCSEL device 10D2 are substantially line-symmetric in plan view with respect to a central axis located substantially in the middle along the first direction of the base substrate 11 and extending along the second direction.

Specifically, a cathode electrode 9711 of the VCSEL device 10D1, and a cathode electrode 9712 of the VCSEL device 10D2 are line-symmetric with respect to the above-mentioned central axis. Cathode pad electrodes 972A1 and 972B1 of the VCSEL device 10D1, and cathode pad electrodes 972A2 and 972B2 of the VCSEL device 10D2 are respectively line-symmetric with respect to the above-mentioned central axis. Cathode wiring electrodes 973A1 and 973B1 of the VCSEL device 10D1, and cathode wiring electrodes 973A2 and 973B2 of the VCSEL device 10D2 are respectively line-symmetric with respect to the above-mentioned central axis.

An anode electrode 9811 of the VCSEL device 10D1, and an anode electrode 9812 of the VCSEL device 10D2 are line-symmetric with respect to the above-mentioned central axis. An anode pad electrode 9821 of the VCSEL device 10D1, and an anode pad electrode 9822 of the VCSEL device 10D2 are line-symmetric with respect to the above-mentioned central axis. An anode wiring electrode 9831 of the VCSEL device 10D1, and an anode wiring electrode 9832 of the VCSEL device 10D2 are line-symmetric with respect to the above-mentioned central axis.

The cathode pad electrodes 972A1 and 972B1 and the anode pad electrode 9821 of the VCSEL 10D1 are arrayed along a direction that is not parallel but has a predetermined angle with respect to each of the first and second directions. The cathode pad electrodes 972A2 and 972B2 and the anode pad electrode 9822 of the VCSEL 10D2 are arrayed along a direction that is not parallel but has a predetermined angle with respect to each of the first and second directions. The direction in which the cathode pad electrodes 972A2 and 972B2 and the anode pad electrode 9822 of the VCSEL 10D2 are arrayed, and the direction in which the cathode pad electrodes 972A1 and 972B1 and the anode pad electrode 9821 of the VCSEL 10D1 are arrayed are not parallel to each other but line-symmetric with respect to the above-mentioned central axis.

The cathode pad electrodes 972A1 and 972B1, the anode pad electrode 9821, the cathode pad electrodes 972A2 and 972B2, and the anode pad electrode 9822 are disposed with an equal spacing d along the first direction.

With this configuration, when performing wire bonding so as to extend the wires along the second direction, the spacing of wire-bond land positions on the VCSEL devices 10D1 and 10D2 becomes constant. Therefore, the wire bond process and the wire bond setting configuration can be simplified, allowing reduction of workload. Furthermore, constraints on wire bonding accuracy determine the minimum size and minimum spacing of the pad electrodes. Accordingly, by disposing the pad electrodes with a constant spacing determined by the minimum size and the minimum spacing, the chip size can be reduced.

A light-emitting region 701D of the VCSEL device 10D1, and a light-emitting region 702D of the VCSEL device 10D2 are line-symmetric with respect to the above-mentioned central axis.

As in the first embodiment mentioned above, a suction region 800D is a region onto which the flat collet sucks. The diameter of the suction region 800D is substantially equal to the second length of the VCSEL array device 1D. When the flat collet having such a shape is to be placed over the VCSEL array device 1D so that the center of the flat collect is aligned with the center of the first direction and the center of the second direction of the VCSEL array device 1D, as illustrated in FIG. 7, a region not included in the suction region 800D is created at either end of the first direction.

Accordingly, as illustrated in FIG. 7, the VCSEL devices 10D1 and 10D2 are arrayed along the first direction in such a way that the light-emitting region 701D and the light-emitting region 702D are not included in the suction region 800D and are line-symmetric with respect to the above-mentioned central axis, thereby preventing damage to the VCSEL devices 10D1 and 10D2 at a mounting as in the embodiments mentioned above.

In the fifth embodiment as well, the cathode pad electrodes and the anode pad electrodes are disposed on the same side with respect to the light-emitting regions 701D and 702D. Therefore, as in the embodiments mentioned above, loss of laser light due to wires can be prevented.

While FIG. 7 is directed to the case where the VCSEL devices 10D1 and 10D2 are precisely line-symmetric with respect to the central axis, the VCSEL devices 10D1 and 10D2 may not necessarily be precisely line-symmetric. It suffices that the VCSEL devices 10D1 and 10D2 be arrayed along the first direction in such a way that the light-emitting region 701D and the light-emitting region 702D are not included in the suction region 800D.

The structures according to the above-mentioned embodiments are illustrative of several examples that provide the operational effects of the present disclosure, and any structure that can be conceived as a combination of these embodiments can provide the same operational effects as the above-mentioned embodiments.

If an electrode pattern is formed in the above-mentioned suction region, a step with a height corresponding to the electrode thickness is created between the region where the electrode pattern is formed, and the region where the electrode pattern is not formed. Because such an electrode pattern is usually thin, suction is possible even in the presence of a step due to the electrode pattern. However, an insulating film for flattening may be provided only in the suction region. This can further improve the suction performance.

The invention claimed is:

1. A vertical-cavity surface-emitting laser device comprising:
   a base substrate;
   an N-type semiconductor multilayer reflecting layer, an active layer including a quantum well, and a P-type semiconductor multilayer reflecting layer located on a surface of the base substrate;
   an anode electrode connected to the P-type semiconductor multilayer reflecting layer; and
   a cathode electrode connected to the N-type semiconductor multilayer reflecting layer,
   a light-emitting-region multilayer portion emitting laser light, the light-emitting-region multilayer portion being narrower than the base substrate when viewed from a direction of the surface of the base substrate and including at least the layers from the N-type semiconductor multilayer reflecting layer upwards,
   the vertical-cavity surface-emitting laser device being adapted to be mounted onto an external circuit board by sucking the vertical-cavity surface-emitting laser device with a collet from a side of the base substrate where the light-emitting-region multilayer portion is located,
   wherein when viewed from the direction of the surface of the base substrate, any region where the light-emitting-region multilayer portion is formed is disposed so as not to overlap a suction region of the collet, and
   wherein a horizontal cross-section of the collet is smaller than that of the base substrate.

2. The vertical-cavity surface-emitting laser device according to claim 1, wherein:
   the base substrate has a first length along a first direction, and a second length along a second direction that is perpendicular to the first direction, the first direction is longer than the second length; and
   when the suction region is substantially equal in size to the second length in both the first direction and the second direction, the region in which the light-emitting-region multilayer portion is formed is located at a predetermined position along the first direction with respect to the suction region, so as to be in contact with or spaced from the suction region.

3. The vertical-cavity surface-emitting laser device according to claim 2, further comprising:
   an anode pad electrode formed on the side of the base substrate where the light-emitting-region multilayer portion is located, the anode pad electrode being connected to the anode electrode; and
   a cathode pad electrode formed on the side of the base substrate where the light-emitting-region multilayer portion is located, the cathode pad electrode being connected to the cathode electrode,
   wherein the anode pad electrode and the cathode pad electrode are disposed on a same side along the second direction with respect to the light-emitting-region multilayer portion.

4. The vertical-cavity surface-emitting laser device according to claim 3, wherein the anode pad electrode and the cathode pad electrode are arrayed along the first direction.

5. The vertical-cavity surface-emitting laser device according to claim 4, wherein the cathode pad electrode includes two cathode pad electrodes, and the two cathode pad electrodes are positioned so as to sandwich the anode pad electrode when viewed from the direction of the surface of the base substrate.

6. The vertical-cavity surface-emitting laser device according to claim 4, wherein a spacing between the anode pad electrode and the cathode pad electrode along the first direction is constant.

7. A vertical-cavity surface-emitting laser array device comprising a plurality of the vertical-cavity surface-emitting laser devices according to claim 1, wherein the light-emitting-region multilayer portions of the vertical-cavity surface-emitting laser devices are spaced a predetermined distance from each other.

8. A vertical-cavity surface-emitting laser array device comprising:
   a plurality of vertical-cavity surface-emitting laser devices arrayed on a base substrate that is a single substrate, the vertical-cavity surface-emitting laser devices each including
   the base substrate,
   an N-type semiconductor multilayer reflecting layer, an active layer including a quantum well, and a P-type semiconductor multilayer reflecting layer formed on a surface of the base substrate,
   an anode electrode connected to the P-type semiconductor multilayer reflecting layer, and
   a cathode electrode connected to the N-type semiconductor multilayer reflecting layer, the vertical-cavity surface-emitting laser devices each having a light-emitting-region multilayer portion emitting light, the light-emitting-region multilayer portion being narrower than the base substrate when viewed from a direction of the surface of the base substrate and including at least the layers from the N-type semiconductor multilayer reflecting layer upwards, the vertical-cavity surface-emitting laser array device being adapted to be mounted to an external circuit board by sucking the vertical-cavity surface-emitting laser array device with a collet from a side of the base substrate where the light-emitting-region multilayer portion is located, wherein when viewed from the direction of the surface of the base substrate, any region where the light-emitting-region multilayer portion is formed is disposed so as not to overlap a suction region of the collet, and wherein a horizontal cross-section of the collet is smaller than that of the base substrate.

9. The vertical-cavity surface-emitting laser array device according to claim 8, wherein:

the base substrate has a first length along a first direction, and a second length along a second direction that is perpendicular to the first direction, the first direction is longer than the second length; and when the suction region is substantially equal in size to the second length in both the first direction and the second direction, the region where the light-emitting-region multilayer portion is formed in each of the vertical-cavity surface-emitting lasers is located at a predetermined position along the first direction with respect to the suction region, so as to be in contact with or spaced from the suction region.

10. The vertical-cavity surface-emitting laser array device according to claim 9, wherein:

each of the vertical-cavity surface-emitting laser devices includes an anode pad electrode formed on the side of the base substrate where the light-emitting-region multilayer portion is located, the anode pad electrode being connected to the anode electrode, and a cathode pad electrode that is formed on the side of the base substrate where the light-emitting-region multilayer portion is located, the cathode pad electrode being connected to the cathode electrode; and the anode pad electrode and the cathode pad electrode of each of the vertical-cavity surface-emitting laser devices are disposed on a same side along the second direction with respect to the light-emitting-region multilayer portion to which the anode pad electrode and the cathode pad electrode are connected.

11. The vertical-cavity surface-emitting laser array device according to claim 10, wherein the anode pad electrode and the cathode pad electrode of each of the vertical-cavity surface-emitting laser devices are arrayed along the first direction.

12. The vertical-cavity surface-emitting laser array device according to claim 11, wherein the cathode pad electrode of each of the vertical-cavity surface-emitting laser devices includes two cathode pad electrodes, and the two cathode pad electrodes are positioned so as to sandwich the anode pad electrode when viewed from the direction of the surface of the base substrate.

13. The vertical-cavity surface-emitting laser array device according to claim 11, wherein a spacing between the anode pad electrode and the cathode pad electrode along the first direction is constant.

\* \* \* \* \*